United States Patent [19]
Iwamatsu et al.

[11] Patent Number: 6,150,696
[45] Date of Patent: Nov. 21, 2000

[54] SEMICONDUCTOR SUBSTRATE AND METHOD OF FABRICATING SEMICONDUCTOR DEVICE

[75] Inventors: Toshiaki Iwamatsu; Yasuo Yamaguchi; Takashi Ipposhi; Shigenobu Maeda; Yuichi Hirano, all of Tokyo, Japan

[73] Assignee: Mitsubishi Denki Kabushiki Kaisha, Tokyo, Japan

[21] Appl. No.: 09/055,903

[22] Filed: Apr. 7, 1998

[30] Foreign Application Priority Data

Oct. 6, 1997 [JP] Japan ................................ P09-272541

[51] Int. Cl.⁷ .................................................... H01L 27/01
[52] U.S. Cl. ........................ 257/347; 257/349; 257/352; 257/354; 438/149
[58] Field of Search .................................... 257/347, 352, 257/354, 349; 438/149

[56] References Cited

U.S. PATENT DOCUMENTS

| | | | |
|---|---|---|---|
| 4,700,461 | 10/1987 | Choi et al. | 438/154 |
| 5,116,771 | 5/1992 | Karulkar | 438/149 |
| 5,597,410 | 1/1997 | Yen | 117/84 |
| 5,834,812 | 11/1998 | Golland et al. | 257/347 |

FOREIGN PATENT DOCUMENTS

| | | | |
|---|---|---|---|
| 4-163907 | 6/1992 | Japan . | |
| 8-153778 | 6/1996 | Japan . | |
| 8-330553 | 12/1996 | Japan . | |
| 4-10-209408 | 8/1998 | Japan | H01L 27/12 |
| 4-10-242091 | 9/1998 | Japan | H01L 21/304 |

*Primary Examiner*—David Hardy
*Assistant Examiner*—George C. Eckert, II
*Attorney, Agent, or Firm*—Oblon, Spivak, McClelland, Maier & Neustadt, P.C.

[57] ABSTRACT

A semiconductor substrate and a method of fabricating a semiconductor device are provided. An oxide film (13) is formed by oxidizing an edge section and a lower major surface of an SOI substrate (10). This oxidizing step is performed in a manner similar to LOCOS (Local Oxide of Silicon) oxidation by using an oxide film (11) exposed on the edge section and lower major surface of the SOI substrate (10) as an underlying oxide film. Then, the thickness of the oxide film (13) is greater than that of the oxide film (11) on the edge section and lower major surface of the SOI substrate (10). The semiconductor substrate prevents particles of dust from being produced at the edge thereof.

4 Claims, 15 Drawing Sheets

SEMICONDUCTOR SUBSTRATE AND METHOD OF FABRICATING SEMICONDUCTOR DEVICE

BACKGROUND OF THE INVENTION

1. Field of the Invention

The present invention relates to a semiconductor substrate and a method of fabricating a semiconductor device and, more particularly, to a semiconductor substrate and a method of fabricating a semiconductor device which prevent particles of dust from being produced at an edge of the substrate.

2. Description of the Background Art

An SOI (silicon on insulator) device including a semiconductor element formed on an SOI substrate is superior to a bulk device in its decreased junction capacitance and improved device isolation breakdown voltage, but has inherent problems to be described below.

FIG. 40 is a sectional view of an SOI substrate 10. The SOI substrate 10 has a triple layer structure comprising a silicon substrate 1, a buried oxide film 2 formed in an upper major surface of the silicon substrate 1, and a single crystalline silicon layer (referred to hereinafter as an SOI layer) 3 formed on the buried oxide film 2. A polysilicon layer 4 is formed on edges and a lower major surface of the single crystalline silicon substrate 1. The polysilicon layer 4 is provided to getter contaminants such as heavy metals provided during wafer fabrication steps and a transistor wafer process. A structure having such a polysilicon layer is known as a poly-back-coat structure (PBC structure).

Methods of fabricating the SOI substrate include a SIMOX (separation by implanted oxygen) method and a bonding method. The SOI substrate fabricated by the SIMOX method (SIMOX substrate) is employed as an example in the following description.

In the SIMOX method, oxygen ions are implanted into a single crystalline silicon substrate at a dose of, for example, $0.4 \times 10^{18}/cm^2$ to $3 \times 10^{18}/cm^2$, and thereafter the silicon substrate is annealed at a temperature of about 1350° C. to provide the SOI structure.

FIG. 41 is a partial detailed view of an edge of the SOI substrate 10. For purposes of explanation, the semiconductor substrate is divided into four sections: an upper major surface (on which semiconductor elements are to be formed), a central section of the upper major surface (including active regions), an edge section including a section surrounding the central section and side surfaces, and a lower major surface.

FIG. 41 shows an area X in detail in which the buried oxide film 2 and the SOI layer 3 meet the polysilicon layer 4. As illustrated in FIG. 41, since the edge section has a curved surface having a great curvature, vertically directed oxygen ions are implanted in a slanting direction into the edge section, decreasing an effective implantation energy in the edge section. The result is the reduction in the thickness of the buried oxide film 2 and the SOI layer 3 in the edge section, creating a structure wherein the SOI layer 3 is prone to exfoliate.

Additionally, the step of thinning the SOI layer 3 during the fabrication of the SOI device promotes the exfoliation of the SOI layer 3. The step of thinning the SOI layer 3 is described with reference to FIGS. 42 and 43.

The SOI layer 3 in the SOI substrate 10 has a suitable thickness as shown in FIG. 42 when the substrate is fabricated. The step of thinning the SOI layer 3 is to suitably reduce the thickness of the SOI layer 3 in accordance with the specs of a desired semiconductor device, and comprises oxidizing the SOI layer 3 and removing the resultant oxide film to adjust the thickness of the SOI layer 3.

FIG. 43 shows an oxide film 5 formed on the SOI layer 3. The thickness of the oxide film 5 is generally determined based on the thickness of the SOI layer 3 in the central section of the SOI substrate 10, that is, semiconductor element formation regions (active regions). The problems that arise herein are the reduced thickness of the SOI layer 3 in the edge section of the SOI substrate 10 as above described, and the formation of the polysilicon layer 4 in the edge section of the SOI substrate 10. An area Y shown in FIG. 42 is illustrated in more detail in FIG. 44, and an area Z shown in FIG. 43 is illustrated in more detail in FIG. 45. FIG. 46 shows the edge section after the removal of the oxide film 5.

As illustrated in FIG. 44, the polysilicon layer 4 is comprised of a multiplicity of single crystal grains GP. Because of individually different crystal orientations of the single crystal grains GP, the oxygen ions are implanted to different depths due to channeling, causing the buried oxide film 2 to be formed at varied depths.

Further, different oxidation rates of the polysilicon layer 4 depending on the crystal orientations of the single crystal grains GP result in different thicknesses of the oxide film 5 in accordance with the respective single crystal grains GP as shown in FIG. 45 after the oxidation of the polysilicon layer 4.

The reduced thickness of the SOI layer 3 in the edge section of the SOI substrate 10 might cause the oxide film 5 to be contact with the buried oxide film 2 depending on the single crystal grains GP and cause the SOI layer 3 to be completely oxidized. In such cases, part of the SOI layer 3 might be surrounded by the buried oxide film 2 and the oxide film 5. For example, an SOI layer 30 shown in FIG. 45 is surrounded by the oxide film 5 and the buried oxide film 2.

When wet etching is performed on the oxide film 5 using an etchant such as hydrofluoric acid for thinning the SOI layer 3 in the SOI substrate 10 under the above described conditions, the buried oxide film 2 as well as the oxide film 5 is etched as shown in FIG. 46. Then, the SOI layer 30 is lifted off into a particle suspended in the etchant. In some cases, the SOI layer 30 might adhere to the central section of the SOI substrate 10. The adhesion of particles to the semiconductor element formation regions causes the formation failures of semiconductor elements and, accordingly, the decrease in fabrication yield.

As above described, the background art semiconductor substrate, particularly the SOI substrate, has the drawback that the SOI layer in the edge section of the substrate exfoliates into particles to cause the decrease in fabrication yield. The production of the particles is also a problem for semiconductor substrates other than the SOI substrate.

SUMMARY OF THE INVENTION

A first aspect of the present invention is intended for a method of fabricating a semiconductor device using a semiconductor substrate having a first major surface, a second major surface opposite from the first major surface, and a side surface, the first major surface including a central section in which active regions are to be formed and a peripheral section, the peripheral section and the side surface defining an edge section. According to the present invention, the method comprises the steps of: (a) forming a first oxide film so as to cover the central section and the edge section of the semiconductor substrate; (b) selectively forming an oxidation-resistant film on the first oxide film in the central section; (c) further oxidizing the edge section of the semiconductor substrate using the oxidation-resistant film as a mask to form a second oxide film in the edge section, the second oxide film being thicker than the first oxide film; and (d) forming semiconductor elements in the active regions.

Preferably, according to a second aspect of the present invention, in the method of the first aspect, the semiconductor substrate is an SOI substrate formed by a SIMOX technique; the semiconductor substrate comprises a buried oxide film and an SOI layer formed in a sequentially stacked relation in the entire first major surface; and the step (c) comprises the step of (c-1) forming the second oxide film so as to completely oxidize the SOI layer extending in the edge section and to oxidize part of the edge section which has not been oxidized.

Preferably, according to a third aspect of the present invention, in the method of the first aspect, the semiconductor substrate is an SOI substrate formed by a bonding technique; the semiconductor substrate comprises an on-substrate oxide film and an SOI layer formed in a sequentially stacked relation on the entire first major surface; and the step (c) comprises the step of (c-1) forming the second oxide film so as to completely oxidize the SOI layer extending in the edge section and to oxidize part of the edge section which has not been oxidized.

Preferably, according to a fourth aspect of the present invention, in the method of the first aspect, the semiconductor substrate is a bulk silicon substrate; the semiconductor substrate comprises a polysilicon layer formed on the edge section and the second major surface; and the step (c) comprises the step of (c-1) forming the second oxide film so that the polysilicon layer is not completely oxidized.

Preferably, according to a fifth aspect of the present invention, in the method of the second aspect, the step (a) comprises the step of forming the first oxide film so that the thickness of the SOI layer in the central section is reduced to a thickness conforming to formation of semiconductor elements.

Preferably, according to a sixth aspect of the present invention, in the method of the fifth aspect, the step (b) comprises the step of forming a pattern of the oxidation-resistant film in accordance with the pattern of a field oxide film defining the active regions in the central section; and the step (c) comprises the step of forming the second oxide film as the field oxide film in accordance with the pattern of the oxidation-resistant film in the central section.

A seventh aspect of the present invention is intended for a method of fabricating a semiconductor device using a semiconductor substrate having a first major surface, a second major surface opposite from the first major surface, and a side surface, the first major surface including a central section in which active regions are to be formed and a peripheral section, the peripheral section and the side surface defining an edge section. According to the present invention, the method comprises the steps of: (a) forming an oxide film so as to cover the central section and the edge section of the semiconductor substrate; (b) forming a resist mask on the oxide film except in the central section; (c) selectively removing the oxide film in the central section using the resist mask as an etching mask to expose the semiconductor substrate, with the oxide film left in the edge section; and (d) forming semiconductor elements in the active regions.

Preferably, according to an eighth aspect of the present invention, the method of the seventh aspect further comprises the step of (e) forming an oxidation-resistant film on the oxide film in the edge section.

Preferably, according to a ninth aspect of the present invention, in the method of the seventh aspect, the semiconductor substrate is an SOI substrate formed by a SIMOX technique; the semiconductor substrate comprises a buried oxide film and an SOI layer formed in a sequentially stacked relation in the entire first major surface; and the step (a) comprises the step of forming the oxide film so that the thickness of the SOI layer in the central section is reduced to a thickness conforming to formation of semiconductor elements.

A tenth aspect of the present invention is intended for a method of fabricating a semiconductor device using a semiconductor substrate having a first major surface, a second major surface opposite from the first major surface, and a side surface, the first major surface including a central section in which active regions are to be formed and a peripheral section, the peripheral section and the side surface defining an edge section, the semiconductor substrate being an SOI substrate formed by a SIMOX technique, the semiconductor substrate including a buried oxide film and an SOI layer formed in a sequentially stacked relation in the entire first major surface. According to the present invention, the method comprises the steps of: (a) forming a first oxide film so as to cover the central section and the edge section of the semiconductor substrate; (b) selectively forming a resist mask on the first oxide film in the central section; (c) selectively removing the first oxide film and the SOI layer in the edge section of the semiconductor substrate using the resist mask as an etching mask to expose the buried oxide film; (d) further oxidizing the first oxide film under the resist mask to form a second oxide film thicker than the first oxide film and to increase the thickness of the buried oxide film exposed; and (e) forming semiconductor elements in the active regions.

An eleventh aspect of the present invention is intended for a method of fabricating a semiconductor device using a semiconductor substrate having a first major surface, a second major surface opposite from the first major surface, and a side surface, the first major surface including a central section in which active regions are to be formed and a peripheral section, the peripheral section and the side surface defining an edge section, the semiconductor substrate being an SOI substrate formed by a SIMOX technique, the semiconductor substrate including a buried oxide film and an SOI layer formed in a sequentially stacked relation in the entire first major surface. According to the present invention, the method comprises the steps of: (a) forming a first oxide film so as to cover the central section and the edge section of the semiconductor substrate; (b) selectively forming a resist mask on the first oxide film in the central section; (c) selectively removing the first oxide film, the SOI layer and the buried oxide film in the edge section of the semiconductor substrate by dry etching using the resist mask as an etching mask to expose an underlying substrate under the SOI layer; (d) further oxidizing the first oxide film under the resist mask to form a second oxide film thicker than the first oxide film and to form a third oxide film on the underlying substrate exposed; and (e) forming semiconductor elements in the active regions.

Preferably, according to a twelfth aspect of the present invention, in the method of the tenth aspect, the step (d) comprises the step of forming the second oxide film so that the thickness of the SOI layer in the central section is reduced to a thickness conforming to formation of semiconductor elements.

A thirteenth aspect of the present invention is intended for a semiconductor substrate having a first major surface, a second major surface opposite from the first major surface, and a side surface, the first major surface including a central section in which active regions are to be formed and a peripheral section, the peripheral section and the side surface defining an edge section. According to the present invention, the semiconductor substrate comprises: a buried oxide film and an SOI layer formed in a sequentially stacked relation in the entire first major surface; and an oxide film formed in the edge section and having a thickness reaching the buried oxide film.

A fourteenth aspect of the present invention is intended for a semiconductor substrate having a first major surface, a second major surface opposite from the first major surface, and a side surface, the first major surface including a central section in which active regions are to be formed and a peripheral section, the peripheral section and the side surface defining an edge section. According to the present invention, the semiconductor substrate comprises: a buried oxide film and an SOI layer formed in a sequentially stacked relation in the first major surface, wherein the buried oxide film contains silicon islands, and wherein the density of the silicon islands is lower in the buried oxide film extending in the edge section than in the buried oxide film in the central section.

A fifteenth aspect of the present invention is intended for a semiconductor substrate having a first major surface, a second major surface opposite from the first major surface, and a side surface, the first major surface including a central section in which active regions are to be formed and a peripheral section, the peripheral section and the side surface defining an edge section. According to the present invention, the semiconductor substrate comprises: a buried oxide film and an SOI layer formed in a sequentially stacked relation in the first major surface, wherein the buried oxide film contain s silicon islands, and wherein the buried oxide film and the SOI layer are not formed in the edge section.

In accordance with the method of the first aspect of the present invention the relatively thick second oxide film is formed on the edge section. If a layer which is prone to exfoliate due to wet etching is present on the edge section and second major surface, the second oxide film functions as a protective film to eliminate the problem that part of the layer which is prone to exfoliate is lifted off into particles suspending in the etchant. This prevents the formation failures of the semiconductor elements resulting from the presence of the particles, increasing the fabrication yield.

In accordance with the method of the second aspect of the present invention, the second oxide film is formed on the edge section of the SOI substrate formed by the SIMOX technique so that the SOI layer in the edge section is completely oxidized and the part of the edge section which has not been oxidized is oxidized. Thus, the SOI layer which is prone to exfoliate due to wet etching is protected, and eliminated is the problem that part of the SOI layer is lifted off into particles suspending in the etchant. This prevents the formation failures of the semiconductor elements resulting from the presence of the particles, increasing the fabrication yield.

In accordance with the method of the third aspect of the present invention, the second oxide film is formed on the edge section of the SOI substrate formed by the bonding technique so that the SOI layer in the edge section is completely oxidized and the part of the edge section which has not been oxidized is oxidized. If the edge section of the on-substrate oxide film and SOI layer is not perfectly chamfered to provide a continuously uneven or rough peripheral configuration in plan view, the uneven or rough periphery is prevented from exfoliating into particles, and the edge section of the on-substrate oxide film is prevented from being partially removed during wet etching.

In accordance with the method of the fourth aspect of the present invention, the bulk silicon substrate includes the polysilicon layer formed on the edge section and second major surface. In this case, the presence of the second oxide film formed on the edge section so that the polysilicon layer is not completely oxidized prevents the polysilicon layer from exfoliating during wet etching due to a structure inherent in the polysilicon layer.

In accordance with the method of the fifth aspect of the present invention, the thickness of the first oxide film is made suitable for thinning the SOI layer. This eliminates the need to reduce the thickness of the SOI layer in a subsequent step, simplifying the steps of processing the semiconductor substrate.

The method of the sixth aspect of the present invention is capable of forming the second oxide film and the field oxide film at the same time, simplifying the steps of processing the semiconductor substrate.

The method of the seventh aspect of the present invention is capable of readily and conveniently forming the oxide film on the edge section of the semiconductor substrate to significantly simplify the steps of processing the semiconductor substrate, reducing processing costs.

In accordance with the method of the eighth aspect of the present invention, the edge section of the semiconductor substrate is rigidly protected by the oxide film and the first oxidation-resistant film.

In accordance with the method of the ninth aspect of the present invention, the thickness of the oxide film is made suitable for thinning the SOI layer. This eliminates the need to reduce the thickness of the SOI layer in a subsequent step, simplifying the steps of processing the semiconductor substrate.

In accordance with the method of the tenth aspect of the present invention, the buried oxide film exposed in the edge section of the SOI substrate is exposed to oxygen serving as an oxidizing agent in the step (d). Thus, as the oxygen is diffused in the buried oxide film to reach silicon islands inherent in the buried oxide film of the SOI substrate formed by the SIMOX technique, the oxygen reacts with silicon to form a silicon oxide film, resulting in disappearance of the silicon islands. The result is the reduced number of silicon islands in the buried oxide film in the edge section of the SOI substrate. If the buried oxide film is removed by wet etching, the silicon islands are prevented from being lifted off into particles.

In accordance with the method of the eleventh aspect of the present invention, dry etching is used to selectively remove the first oxide film, the SOI layer, and the buried oxide film in the edge section of the semiconductor substrate. This permits the silicon islands inherent in the buried oxide film of the SOI substrate formed by the SIMOX technique to disappear in the edge section of the semiconductor substrate, preventing the silicon islands from being lifted off into particles during wet etching.

In accordance with the method of the twelfth aspect of the present invention, the thickness of the second oxide film is made suitable for thinning the SOI layer. This eliminates the need to reduce the thickness of the SOI layer in a subsequent step, simplifying the steps of processing the semiconductor substrate.

In accordance with the semiconductor substrate of the thirteenth aspect of the present invention, the presence of the oxide film formed on the edge section of the semiconductor substrate and having the thickness reaching the buried oxide film may protect the SOI layer which is prone to exfoliate due to wet etching to eliminate the problem that part of the SOI layer is lifted off into particles suspending in the etchant. This prevents the formation failures of the semiconductor elements resulting from the presence of the particles, providing semiconductor substrates with an increased fabrication yield.

In accordance with the semiconductor substrate of the fourteenth aspect of the present invention, the density of the silicon islands is lower in the buried oxide film in the edge section of the semiconductor substrate than in the buried oxide film in the central section of the first major surface. If the buried oxide film is removed by wet etching, the semiconductor substrate which prevents the silicon islands from being lifted off into particles is accomplished.

In accordance with the semiconductor substrate of the fifteenth aspect of the present invention, the buried oxide film and the SOI layer are not formed in the edge section of the semiconductor substrate. This accomplishes the semiconductor substrate which prevents the silicon islands from being lifted off into particles during wet etching.

It is therefore an object of the present invention to provide a semiconductor substrate and a method of fabricating a semiconductor device which prevent particles of dust from being produced at an edge of the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

A semiconductor substrate and a method of fabricating a semiconductor device according to a first preferred embodiment of the present invention will now be described with reference to FIGS. 1 through 6. For purposes of explanation, the semiconductor substrate is divided into four sections: an upper major surface (on which semiconductor elements are to be formed), a central section of the upper major surface (including active regions), an edge section including a section surrounding the central section and side surfaces, and a lower major surface.

A-1. Processing Method

Figure 1:
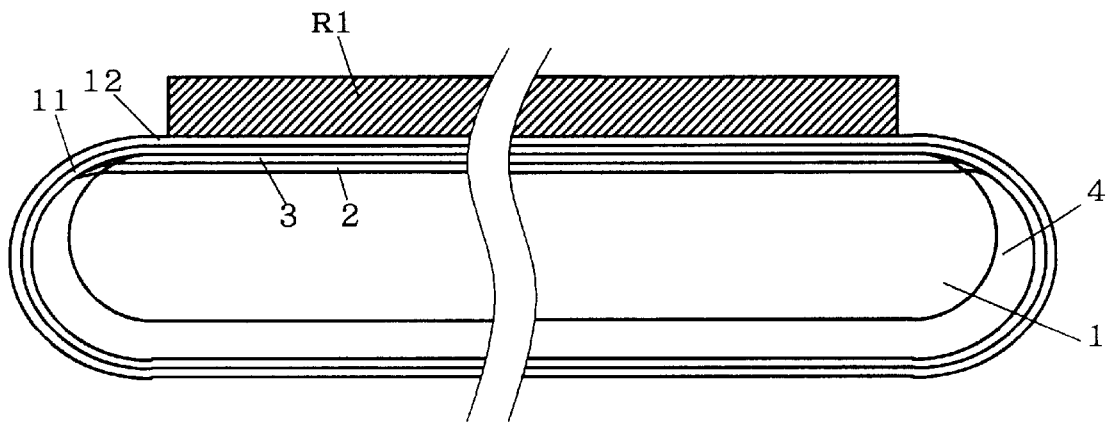
FIG. 1 is a sectional view illustrating the step of processing a semiconductor substrate according to a first preferred embodiment of the present invention.

Referring to FIG. 1, a silicon oxide film (referred to hereinafter as an oxide film) 11 having a thickness of 100 to 400 angstroms is formed so as to entirely cover an SOI substrate 10. The oxide film 11 (first oxide film) may be formed by thermally oxidizing the SOI substrate 10 at a temperature on the order of 700 to 1100° C. or by the CVD process at a temperature on the order of 600 to 850° C.

The SOI substrate 10 has a triple layer structure comprising a single crystalline silicon substrate (bulk silicon substrate) 1, a buried oxide film 2 formed on the upper major surface of the single crystalline silicon substrate 1, and a single crystalline silicon layer (referred to hereinafter as an SOI layer) 3 formed on the buried oxide film 2. A polysilicon layer 4 is formed on the edge section and lower major surface of the single crystalline silicon substrate 1. The polysilicon layer 4 is provided to getter contaminants such as heavy metals provided during wafer fabrication steps. A structure having such a polysilicon layer is known as a poly-back-coat structure (PBC structure).

The SOI substrate fabricated by the SIMOX method (SIMOX substrate) is employed as an example in the following description.

First, a silicon nitride film (referred to hereinafter as a nitride film) 12 serving as an oxidation-resistant film and having a thickness of 1000 to 4000 angstroms is formed by the CVD process at a temperature on the order of 600 to 850° C. so as to entirely cover the oxide film 11.

Figure 2:
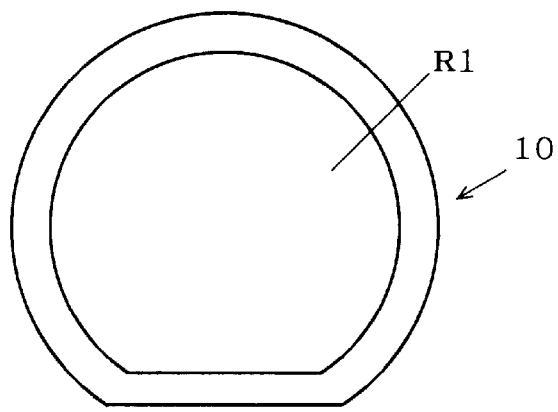
FIG. 2 is a plan view illustrating the step of processing the semiconductor substrate according to the first preferred embodiment of the present invention.

A resist mask R1 is selectively formed so as to cover the central section of the upper major surface (on which the active regions are to be formed) of the SOI substrate 10. FIG. 2 is a plan view of the SOI substrate 10 as viewed from above the upper major surface thereof. The resist mask R1 is not formed in the edge section of the SOI substrate 10 as shown in FIG. 2. The range of the resist mask R1 to be formed is set to entirely cover the active regions wherein semiconductor elements are to be formed.

Figure 3:
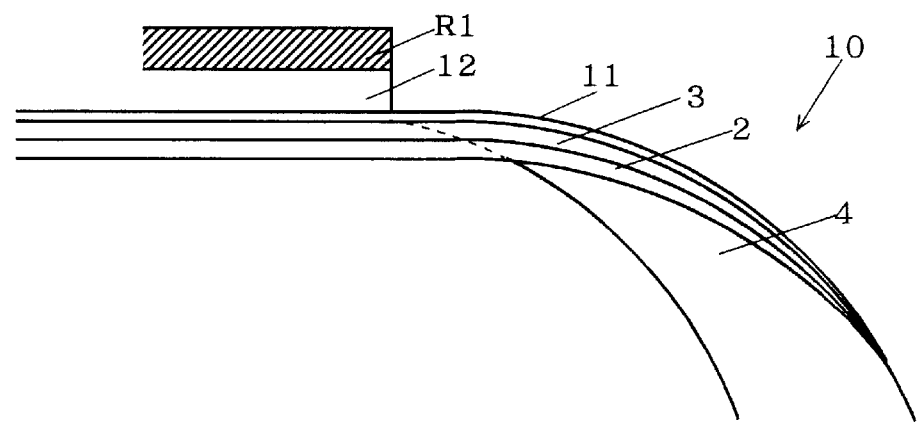
FIGS. 3 through 6 are sectional views illustrating the steps of processing the semiconductor substrate according to the first preferred embodiment of the present invention.

Dry etching is performed using the resist mask R1 as an etching mask to selectively remove the nitride film 12 so that the nitride film 12 is left only under the resist mask R1 as shown in FIG. 3. That is, the nitride film 12 is removed and the oxide film 11 is exposed in the edge section of the SOI substrate 10 which is not covered with the resist mask R1. The nitride film 12 is removed throughout the lower major surface of the SOI substrate 10. Wet etching using, for example, thermal phosphoric acid may be employed for removal of the nitride film 12.

Figure 4:
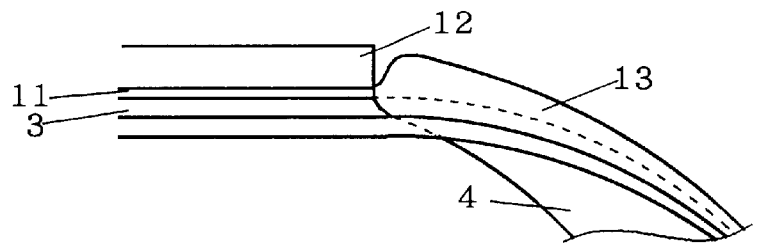

In the step shown in FIG. 4, an oxide film 13 (second oxide film) is formed by oxidizing the edge section and the lower major surface of the SOI substrate 10. This oxidizing step is performed in a manner similar to LOCOS (Local Oxide of Silicon) oxidation by using the oxide film 11 exposed on the edge section and lower major surface of the SOI substrate 10 as an underlying oxide film. The conditions of this oxidizing step to be selected are such that all of the SOI layer 3 except under the nitride film 12 is oxidized. For example, when the SOI layer 3 under the nitride film 12 has a thickness of 2000 angstroms, the oxide film 13 should have a thickness of not less than 5000 angstroms.

Figure 5:
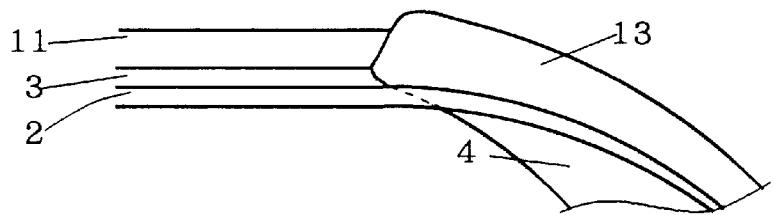

Next, in the step shown in FIG. 5, the nitride film 12 is removed, and then the thickness of the SOI layer 3 which has been positioned under the nitride film 12 is suitably reduced in accordance with the specs of a desired semiconductor device. That is, the SOI layer 3 is thinned by further oxidizing the oxide film 11 to increase the thickness of the oxide film 11. In this step, the thickness of the oxide film 13 formed on the edge section and lower major surface of the SOI substrate 10 is also increased. For reduction in the thickness of the SOI layer 3 by 1000 angstroms, the oxidizing conditions should be set so that the thickness of the oxide film 11 is increased by 2000 angstroms.

Figure 6:
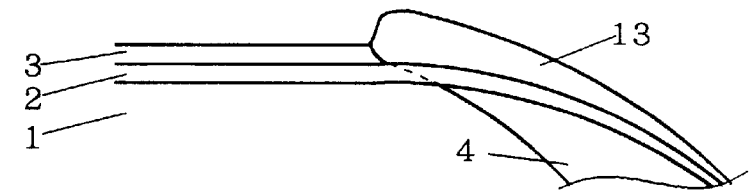

In the step shown in FIG. 6, the thickened oxide film 11 is removed by wet etching.

A-2. Characteristic Function and Effect

In the step of thinning the SOI layer 3, as above described, the thickness of the oxide film 13 formed on the edge section and lower major surface of the SOI substrate 10 is also reduced. However, since the thickness of the oxide film 13 is originally greater than that of the oxide film 11 and is increased in the step of thinning the SOI layer 3, the oxide film 13 is not completely removed during the etching of the oxide film 11. Further, the oxide film 13 is formed so that the SOI layer 3 is not left in the edge section and lower major surface of the SOI substrate 10. This eliminates the drawback that part of the SOI layer 3 is lifted off into particles suspending in the etchant to prevent the formation failures of the semiconductor elements resulting from the presence of the particles, increasing the fabrication yield.

In subsequent steps, MOS transistors and bipolar transistors are made into the SOI layer 3 on the upper major surface of the SOI substrate 10 with the oxide film 13 formed on the edge section and lower major surface thereof to construct a DRAM, an SRAM and a logic circuit.

A-3. Modifications

Although the present invention is applied to the SOI substrate having the PBC structure in the above description, the present invention may be applied to an SOI substrate having no PBC structure wherein particles might be produced.

Figure 7:
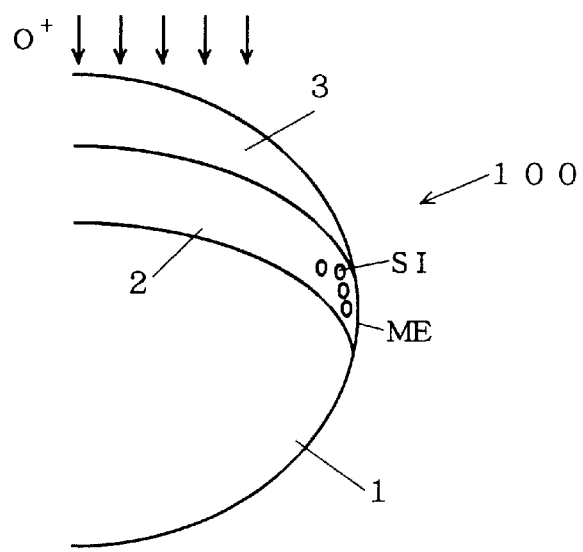
FIG. 7 is a sectional view showing an endmost edge of the semiconductor substrate.

FIG. 7 is a sectional view of an endmost edge of an SOI substrate 100 having no PBC structure. As shown in FIG. 7, when oxide ions are implanted into the silicon substrate 1 to form the buried oxide film 2, the oxide ions might be implanted into a section which should be the SOI layer at an endmost edge ME of the SOI substrate 100 to form an oxide film therein. Then, the endmost edge ME is not entirely oxidized, but granular single crystalline silicon regions (referred to hereinafter as silicon islands SI) are partially left and might flow as particles into the etchant during the wet etching of the oxide film. As described in the first preferred embodiment, however, the oxide film 13 formed on the edge section and lower major surface prevents the silicon islands SI from becoming the particles.

B. Second Preferred Embodiment

The first preferred embodiment of the present invention describes the structure for preventing the SOI layer 3 at the edge of the SOI substrate 10 from being partially lifted off into particles. In some cases, however, the silicon islands contained in the buried oxide film 2 might be a source of particles.

Figure 8:
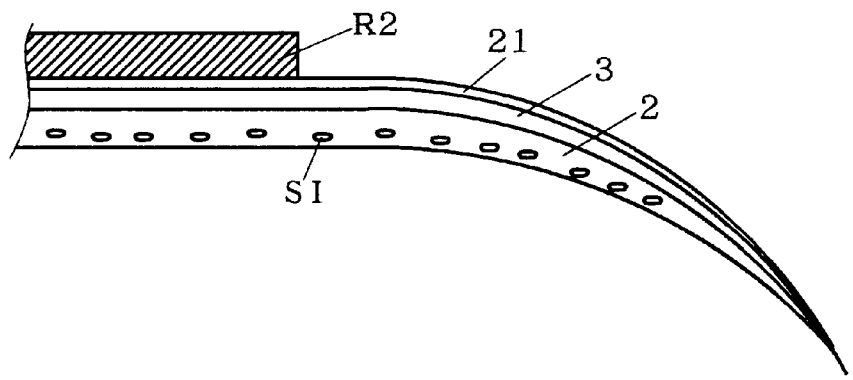
FIGS. 8 through 11 are sectional views illustrating the steps of processing the semiconductor substrate according to a second preferred embodiment of the present invention.

The silicon islands are discussed below. A plurality of silicon islands SI are present in the buried oxide film 2 as shown in FIG. 8. The silicon islands SI are produced when the buried oxide film 2 is formed by ion implantation, and are inherent in the SIMOX substrate. Specifically, while oxygen ions are implanted into the silicon substrate to form the buried oxide film 2, silicon atoms which do not react with the oxygen ions are combined to each other during the SIMOX annealing step to form silicon masses which result in the silicon islands SI.

Since many of the silicon islands SI are present in a relatively deep part of the buried oxide film 2, the silicon islands SI, in general, do not appear on the surface of the buried oxide film 2 if the buried oxide film 2 is etched in some amounts. However, in the edge section of the SOI substrate 10 where the SOI layer 3 and the buried oxide film 2 are relatively thin as shown in FIG. 8, the silicon islands SI are exposed by etching and, in some cases, lifted off into particles.

A structure for reducing the particles resulting from the silicon islands is described hereinafter in a second preferred embodiment of the semiconductor substrate and the method of fabricating the semiconductor device according to the present invention with reference to FIGS. 8 through 11.

B-1. Processing Method

First, an oxide film 21 (first oxide film) having a thickness of 100 to 400 angstroms is formed so as to entirely cover the SOI substrate 10 as shown in FIG. 8. The oxide film 21 may be formed by thermally oxidizing the SOI substrate 10 at a temperature on the order of 700 to 1100° C. or by the CVD process at a temperature on the order of 600 to 850° C.

Then, a resist mask R2 is selectively formed so as to cover the central section of the upper major surface (on which the active regions are to be formed) of the SOI substrate 10. The range of the resist mask R1 to be formed is set to entirely cover a region in which the active regions are to be formed.

Figure 9:
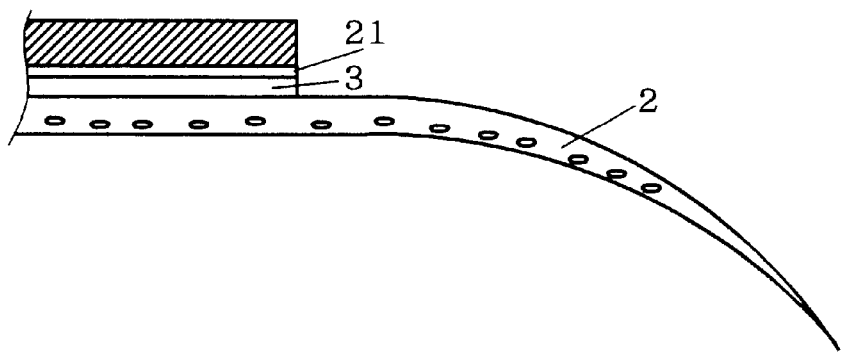

Dry etching is performed using the resist mask R2 as an etching mask to selectively remove parts of the oxide film 21 and SOI layer 3 which are not covered with the resist mask R2 so that the oxide film 21 and the SOI layer 3 are left only under the resist mask R2 as shown in FIG. 9. That is, the oxide film 21 and the SOI layer 3 are removed and the buried oxide film 2 is exposed in the edge section and lower major surface of the SOI substrate 10 which are not covered with the resist mask R2.

Figure 10:
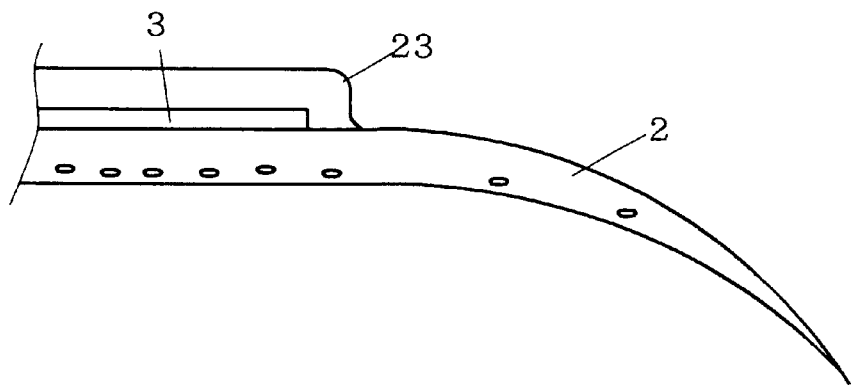

Next, the resist mask R2 is removed, and then the thickness of the SOI layer 3 which has been positioned under the resist mask R2 is suitably reduced in accordance with the specs of a desired semiconductor device as shown in FIG. 10. That is, the SOI layer 3 is thinned by further oxidizing the oxide film 21 to form an oxide film 23 (second oxide film). For reduction in the thickness of the SOI layer 3 by 1000 angstroms, the oxidizing conditions should be set so that the thickness of the oxide film 23 is thicker than the oxide film 21 by 2000 angstroms. At this time, the buried oxide film 2 in the edge section and lower major surface of the SOI substrate 10 is exposed to oxygen serving as an oxidizing agent. When the oxygen is diffused in the buried oxide film 2 to reach the silicon islands SI, the oxygen reacts with silicon to form a silicon oxide film, resulting in the disappearance of the silicon islands SI.

B-2. Characteristic Function and Effect

Figure 11:
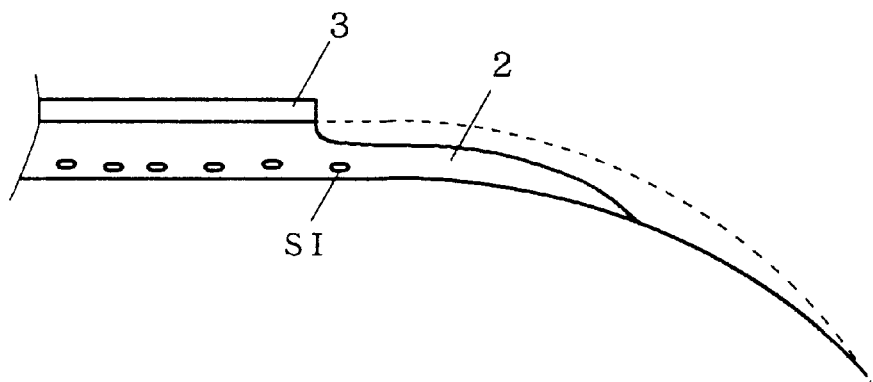

In the step of thinning the SOI layer 3, as above described, the silicon islands SI are reduced in the edge section of the SOI substrate 10 if the oxide film 23 formed for thinning the SOI layer 3 is removed by wet etching as shown in FIG. 11. This prevents the silicon islands SI from being lifted off into particles.

Although described above is the disappearance of the silicon islands SI in conjunction with the further oxidization and thickening of the oxide film 21 for thinning the SOI layer 3, the silicon islands SI may vanish in other oxidizing steps which do not follow the step wherein the edge section of the SOI substrate 10 is subjected to wet etching.

B-3. Modifications of Processing Method

Although the silicon islands SI vanish in conjunction with the further oxidization and thickening of the oxide film 21 for thinning the SOI layer 3 in the second preferred embodiment of the present invention as above described, the buried oxide film 2 in the edge section of the SOI substrate 10 may be removed to prevent the silicon islands SI from becoming the particles.

Figure 12:
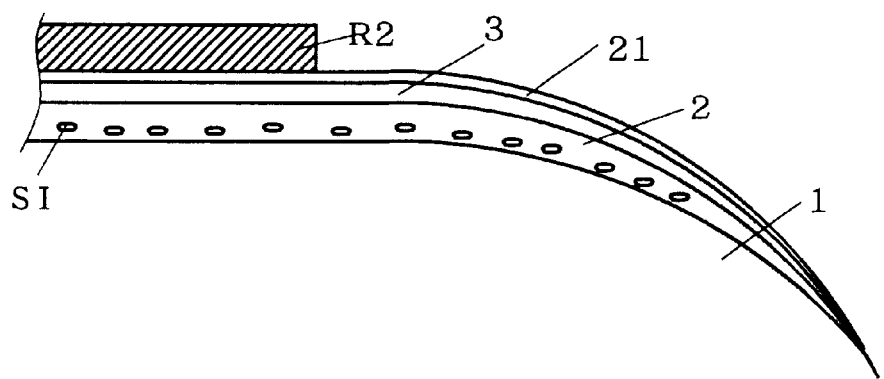
FIGS. 12 through 14 are sectional views illustrating the steps of processing the semiconductor substrate according to a modification of the second preferred embodiment of the present invention.

Specifically, as shown in FIG. 12, the oxide film 21 is formed so as to entirely cover the SOI substrate 10, and the resist mask R2 is selectively formed so as to cover the central section of the upper major surface of the SOI substrate 10.

Figure 13:
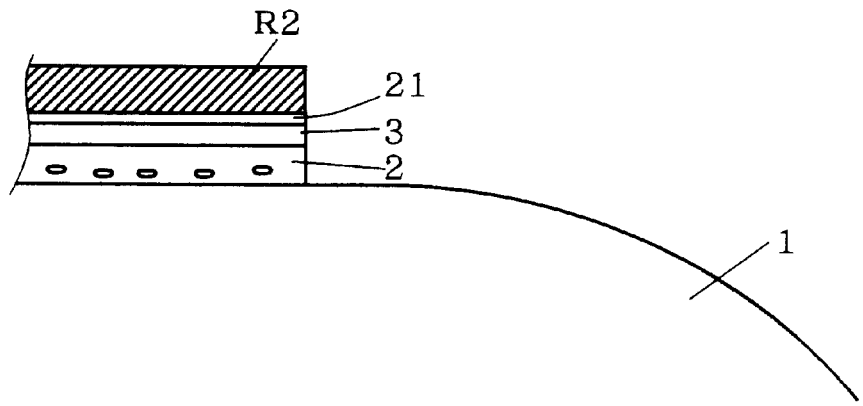

Dry etching is performed using the resist mask R2 as an etching mask to selectively remove parts of the oxide film 21, the SOI layer 3 and the buried oxide film 2 which are not covered with the resist mask R2 in sequential order so that the oxide film 21, the SOI layer 3 and the buried oxide film 2 are left only under the resist mask R2 as shown in FIG. 13. Such dry etching is also performed on the lower major surface of the SOI substrate 10, thereby exposing the silicon substrate 1 (underlying substrate) in the edge section and lower major surface of the SOI substrate 10 which are not covered with the resist mask R2.

Figure 14:
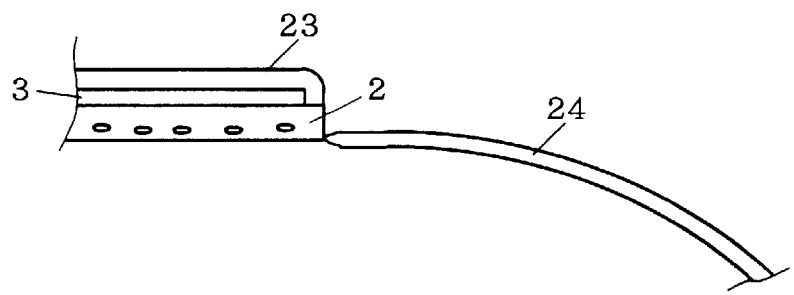

Next, the resist mask R2 is removed, and then the thickness of the SOI layer 3 which has been positioned under the resist mask R2 is suitable reduced in accordance with the specs of a desired semiconductor device as shown in FIG. 14. That is, the SOI layer 3 is thinned by further oxidizing the oxide film 21 to form the oxide film 23. At this time, an oxide film 24 is formed on the exposed surface of the silicon substrate 1.

The removal of the buried oxide film 2 in the edge section of the SOI substrate 10 by dry etching permits the silicon islands SI to disappear in the edge section of the SOI substrate 10, preventing the silicon islands SI from becoming the particles during the removal by the wet etching of the oxide film 23 formed for thinning the SOI layer 3.

C. Third Preferred Embodiment

The first and second preferred embodiments of the present invention describe the structure for preventing the SOI layer 3 in the edge section of the SIMOX substrate from producing the particles and the structure for preventing the silicon islands in the buried oxide film of the SIMOX substrate from producing the particles. In some cases, however, particles might be produced in the SOI substrate fabricated by the bonding method (bonded substrate).

Figure 15:
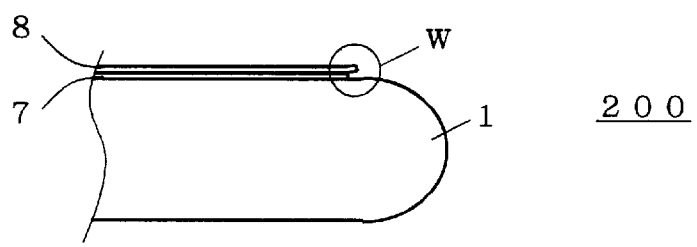
FIGS. 15 through 18 are sectional views illustrating the steps of processing the semiconductor substrate according to a third preferred embodiment of the present invention.

The bonded substrate is fabricated by forming an oxide film on an upper major surface (on which semiconductor elements are to be formed) of a first silicon substrate, bonding a second silicon substrate to an upper surface of the oxide film, and polishing the second silicon substrate to a predetermined thickness, thereby providing an SOI structure. FIG. 15 is a sectional view of the edge section of an SOI substrate 200 formed in this manner.

Referring to FIG. 15, the silicon substrate 1, an on-substrate oxide film 7 formed on the upper major surface of the silicon substrate 1, and a silicon layer 8 formed on the oxide film 7 constitute an SOI structure. The on-substrate oxide film 7 corresponds to the buried oxide film, and the silicon layer 8 corresponds to the SOI layer.

In the SOI substrate 200 having the above structure, the on-substrate oxide film 7 and the silicon layer 8 are not perfectly chamfered in the edge section, but provide a continuously uneven or rough peripheral configuration in plan view in some cases. The uneven or rough periphery sometimes exfoliates into particles during the transportation of the substrate.

Figure 16:
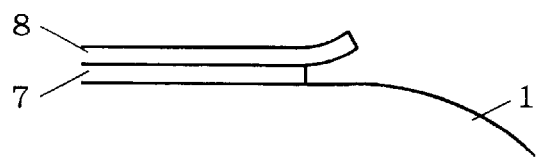

Further, an etchant might enter the edge section where the on-substrate oxide film 7 is exposed during wet etching to partially remove the on-substrate oxide film 7. FIG. 16 is a detailed view of an area W shown in FIG. 15.

With reference to FIG. 16, part of the on-substrate oxide film 7 at the edge of the SOI layer 8 is removed to cause the SOI layer 8 to partially dangle. Under these conditions, the SOI layer 8 is liable to exfoliate into particles A structure for reducing the particles in the bonded substrate is described hereinafter in a third preferred embodiment of the semiconductor substrate and the method of fabricating the semiconductor device according to the present invention with reference to FIGS. 17 and 18.

C-1. Processing Method

Figure 17:
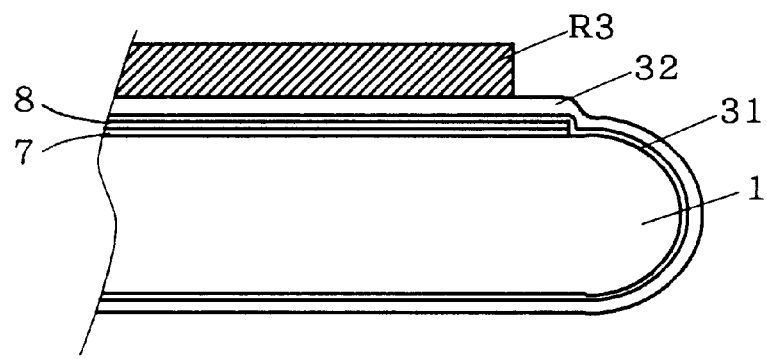

Referring to FIG. 17, an oxide film 31 (first oxide film) having a thickness of 100 to 400 angstroms is formed so as to entirely cover the SOI substrate 200. The oxide film 31 may be formed by thermally oxidizing the SOI substrate 200 at a temperature on the order of 700 to 1100° C. or by the CVD process at a temperature on the order of 600 to 850° C.

Then, a nitride film 32 (oxidation-resistant film) having a thickness of 1000 to 4000 angstroms is formed by the CVD process at a temperature on the order of 600 to 850° C. so as to entirely cover the oxide film 31.

Then, a resist mask R3 is selectively formed so as to cover the central section of the upper major surface (on which the active regions are to be formed) of the SOI substrate 200.

Dry etching is performed using the resist mask R3 as an etching mask to selectively remove the nitride film 32, and thereafter the resist mask R3 is removed to leave the nitride film 32 only in the central section of the upper major surface That is, the nitride film 32 is removed and the oxide film 31 is exposed in an area extending from the edge section of the SOI layer 8 to the edge section and lower major surface of the silicon substrate 1 which has not been covered with the resist mask R3. The nitride film 32 is removed throughout the lower major surface of the SOI substrate 200. Wet etching using, for example, thermal phosphoric acid may be employed for removal of the nitride film 32.

Figure 18:
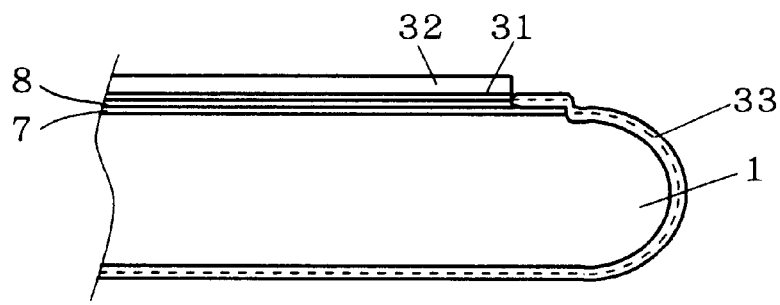

In the step shown in FIG. 18, an oxide film 33 (second oxide film) is formed by oxidizing the area extending from the edge section of the SOI layer 8 to the edge section and lower major surface of the silicon substrate 1. This oxidizing step is performed in a manner similar to the LOCOS oxidation by using the oxide film 31 exposed in the area extending from the edge section of the SOI layer 8 to the edge section and lower major surface of the silicon substrate 1 as an underlying oxide film. The conditions of this oxidizing step to be selected are such that all of the SOI layer 8 except under the nitride film 32 is oxidized.

The nitride film 32 is removed, and then the thickness of the SOI layer 8 which has been positioned under the nitride film 32 is suitably reduced in accordance with the specs of a desired semiconductor device. Such a film thinning step of the third preferred embodiment is similar to that of the first preferred embodiment described with reference to FIGS. 5 and 6, and the description thereof will be dispensed with herein.

C-2. Characteristic Function and Effect

In the SOI substrate 200 which is the bonded substrate, as above described, the oxide film 33 is formed in the area extending from the edge section of the SOI layer 8 to the edge section and lower major surface of the silicon substrate 1. This prevents the on-substrate oxide film 7 and the silicon layer 8 from exfoliating at their edges into particles during the transportation of the SOI substrate 200 and due to wet etching during the step of thinning the SOI layer 8.

D. Fourth Preferred Embodiment

Figure 44:
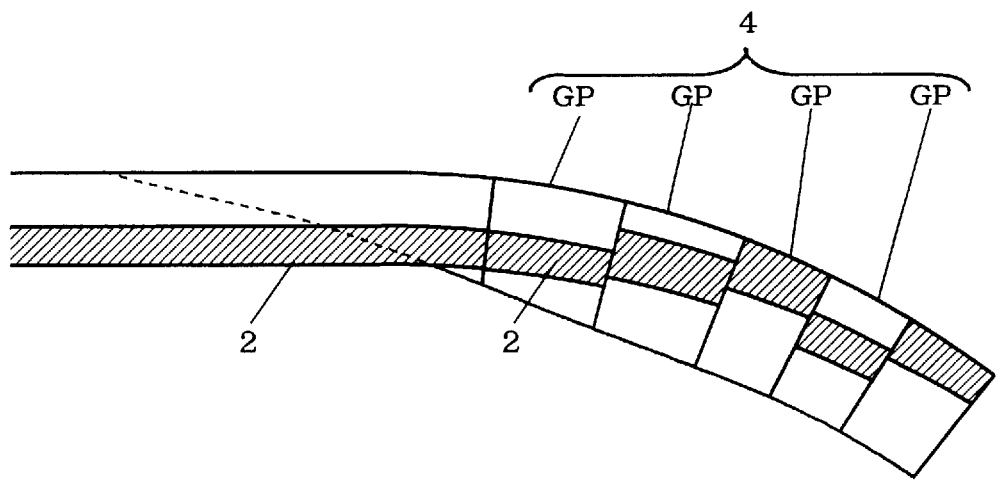
FIGS. 44 through 46 are sectional views illustrating problems in the conventional steps of processing the SOI substrate.
Figure 45:
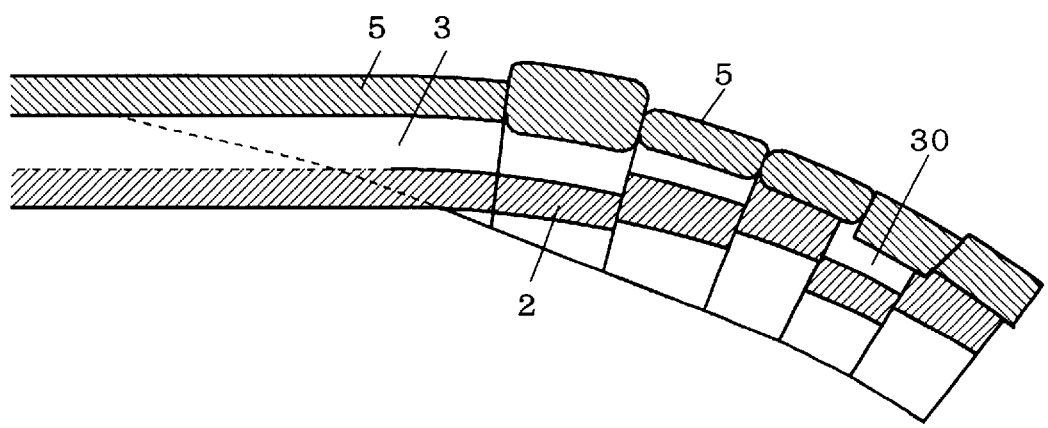
Figure 46:
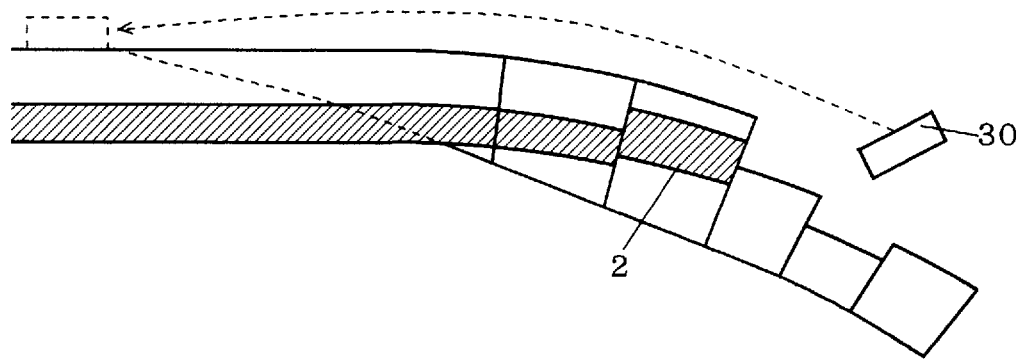

The first to third preferred embodiments of the present invention describe the reduction in the particles in the SOI substrate. In some cases, however, a polysilicon layer might exfoliate into particles in a bulk silicon substrate having the PBC structure. Specifically, as stated with reference to FIG. 44, the polysilicon layer is comprised of a multiplicity of single crystal grains. During the oxidation of the polysilicon layer, oxygen serving as an oxidizing agent might enter the gaps between the single crystal grains to form oxide films surrounding the single crystal grains. Under such circumstances, if the oxide film is removed by wet etching, there is a strong likelihood that the single crystal grains are lifted off into particles.

A structure for reducing the particles in the bulk silicon substrate is described hereinafter in a fourth preferred embodiment of the semiconductor substrate and the method of fabricating the semiconductor device according to the present invention with reference to FIGS. 19 and 20.

D-1. Processing Method

Figure 19:
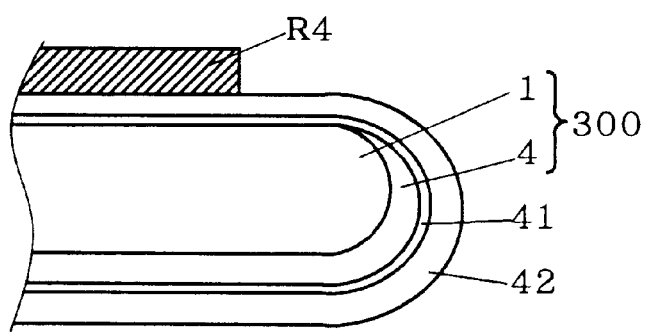
FIGS. 19 and 20 are sectional views illustrating the steps of processing the semiconductor substrate according to a fourth preferred embodiment of the present invention.

With reference to FIG. 19, the polysilicon layer 4 is formed on the edge section and lower major surface of the single crystalline silicon substrate (bulk silicon substrate) 1. A substrate comprised of the silicon substrate 1 and the polysilicon layer 4 is referred to hereinafter as a silicon substrate 300.

As illustrated in FIG. 19, an oxide film 41 (first oxide film) having a thickness of 100 to 400 angstroms is formed so as to entirely cover the silicon substrate 300. The oxide film 41 may be formed by thermally oxidizing the silicon substrate 300 at a temperature on the order of 700 to 1100° C. or by the CVD process at a temperature on the order of 600 to 850° C.

Then, a nitride film 42 (oxidation-resistant film) having a thickness of 1000 to 4000 angstroms is formed by the CVD process at a temperature on the order of 600 to 850° C. so as to entirely cover the oxide film 41.

Then, a resist mask R4 is selectively formed so as to cover the central section of the upper major surface (on which the active regions are to be formed) of the silicon substrate 300.

Dry etching is performed using the resist mask R4 as an etching mask to selectively remove the nitride film 42, and thereafter the resist mask R4 is removed to leave the nitride film 42 only in the central section of the upper major surface. That is, the nitride film 42 is removed and the oxide film 41 is exposed in the edge section of the silicon substrate 300 which has not been covered with the resist mask R4. The nitride film 42 is removed throughout the lower major surface of the silicon substrate 300. Wet etching using, for example, phosphoric acid at elevated temperatures may be employed for removal of the nitride film 42.

Figure 20:
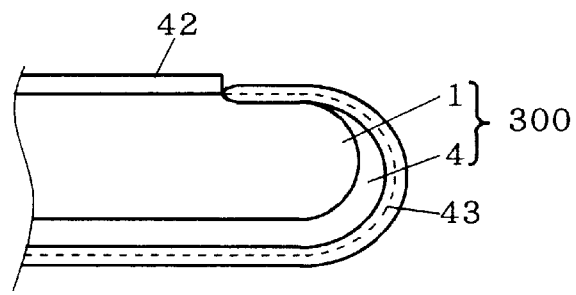

In the step shown in FIG. 20, an oxide film 43 (second oxide film) is formed on the edge section and lower major surface of the silicon substrate 300. This oxidizing step is performed in a manner similar to the LOCOS oxidation by using the oxide film 41 exposed in an area extending from the edge section to the lower major surface of the silicon substrate 300 as an underlying oxide film. The conditions of this oxidizing step to be selected are such that the oxide film 43 is thick enough to preclude all of the polysilicon layer 4 from being oxidized and to be difficult to remove by the subsequent step of wet etching, for example, 4000 to 5000 angstroms in thickness.

D-2. Characteristic Function and Effect

As above described, the oxide film 43 is formed extending from the edge section to the lower major surface of the silicon substrate 300, and has such a thickness that it is not easily removed by wet etching. Thus, if the oxidizing agent enters the gaps between the single crystal grains of the polysilicon layer 4 to form the oxide film surrounding the single crystal grains, the polysilicon layer 4 is prevented from being lifted off into particles during wet etching.

E. Fifth Preferred Embodiment

E-1. Processing Method

A fifth preferred embodiment of the semiconductor substrate and the method of fabricating the semiconductor device according to the present invention is described with reference to FIGS. 21 through 23 which show the processing steps.

Figure 21:
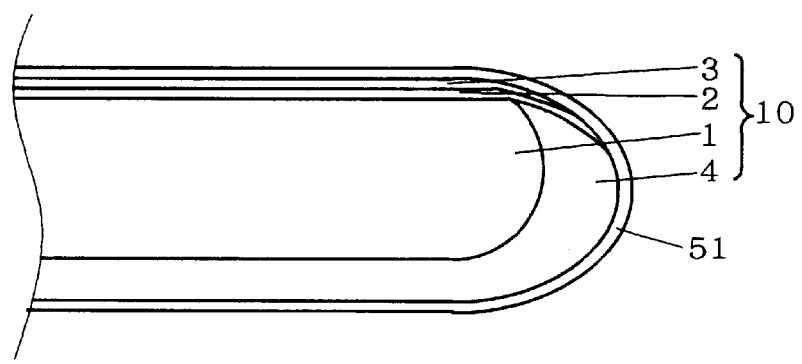
FIGS. 21 through 23 are sectional views illustrating the steps of processing the semiconductor substrate according to a fifth preferred embodiment of the present invention.

First, as shown in FIG. 21, an oxide film 51 is formed so as to entirely cover the SOI substrate 10. The oxide film 51 may be formed by thermally oxidizing the SOI substrate 10 at a temperature on the order of 700 to 1100° C. or by the CVD process at a temperature on the order of 600 to 850° C. The polysilicon layer 4 is formed on the edge section and lower major surface of the silicon substrate 1 to constitute the PBC structure.

Figure 22:
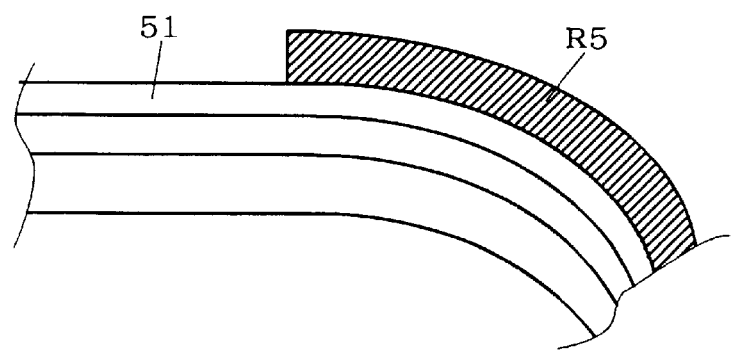

As depicted in FIG. 22, a resist mask R5 is selectively formed so as to cover the edge section and lower major surface of the SOI substrate 10. In the central section of the upper major surface of the SOI substrate 10, the resist mask R5 is not formed and the oxide film 51 is exposed. The exposed oxide film 51 is selectively removed by wet etching.

Figure 23:
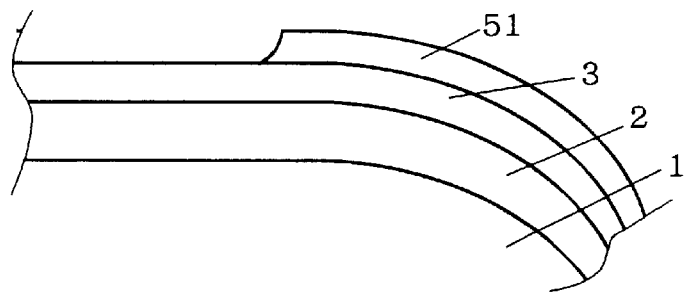

Thereafter, the resist mask R5 is removed to provide a structure as shown in FIG. 23 wherein the oxide film 51 covers the edge section and lower major surface of the silicon substrate 1 and the SOI layer 3 is exposed in the central section of the upper major surface of the SOI substrate 10.

E-2. Characteristic Function and Effect

The step of suitably reducing the thickness of the exposed SOI layer 3 in accordance with the specs of a desired semiconductor device is similar to that of the first preferred embodiment described with reference to FIGS. 5 and 6, and the description thereof will be dispensed with herein. The oxide film 51 is not completely removed in the step of reducing the thickness of the SOI layer 3. The fifth preferred embodiment does not present the problem that the SOI layer 3 under the oxide film 51 is lifted off into particles suspended in the etchant, to prevent the formation failures of the semiconductor elements resulting from the presence of the particles, thereby increasing the fabrication yield.

Moreover, setting the thickness of the oxide film 51 to a thickness for thinning the SOI layer 3 eliminates the need to form the oxide film again for the thinning step. To this end, the thickness of the oxide film 51 should be set so that the thickness of the SOI layer 3 conforms to the specs of the desired semiconductor device.

F. Sixth Preferred Embodiment

F-1. Processing Method

A sixth preferred embodiment of the semiconductor substrate and the method of fabricating the semiconductor device according to the present invention is described with reference to FIGS. 24 through 28 which show the processing steps.

Figure 24:
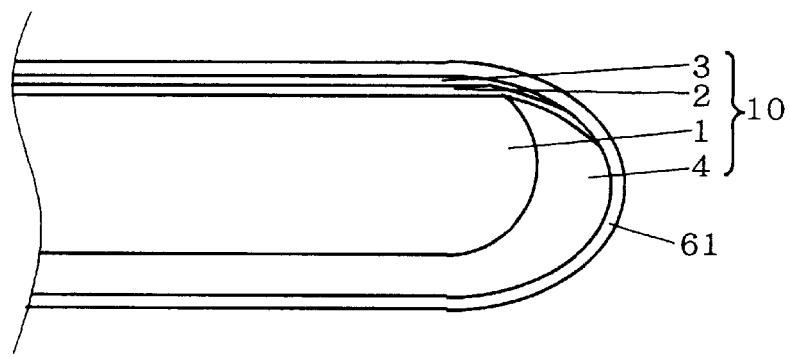
FIGS. 24 through 28 are sectional views illustrating the steps of processing the semiconductor substrate according to a sixth preferred embodiment of the present invention.
Figure 25:
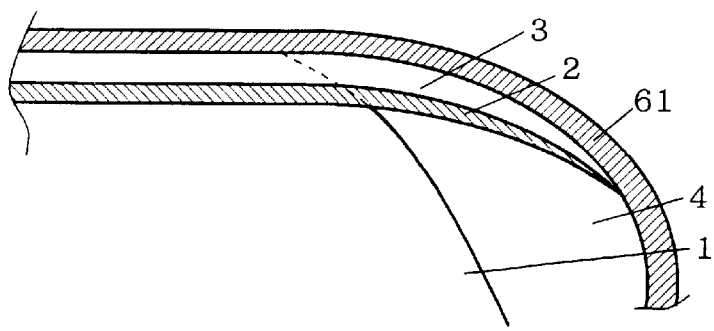

First, as shown in FIG. 24, an oxide film 61 (first oxide film) having a thickness of, for example, 1600 angstroms is formed so as to entirely cover the SOI substrate 10. The thickness of the oxide film 61 is set to the thickness for thinning the SOI layer 3. That is, the thickness of the oxide film 61 is set so that the thickness of the SOI layer 3 conforms to the specs of a desired semiconductor device. FIG. 25 shows the details of an area Z shown in FIG. 24.

The oxide film 61 may be formed by thermally oxidizing the SOI substrate 10 at a temperature on the order of 700 to 1100° C. or by the CVD process at a temperature on the order of 600 to 850° C. The polysilicon layer 4 is formed on the edge section and lower major surface of the silicon substrate 1 to constitute the PBC structure.

Figure 26:
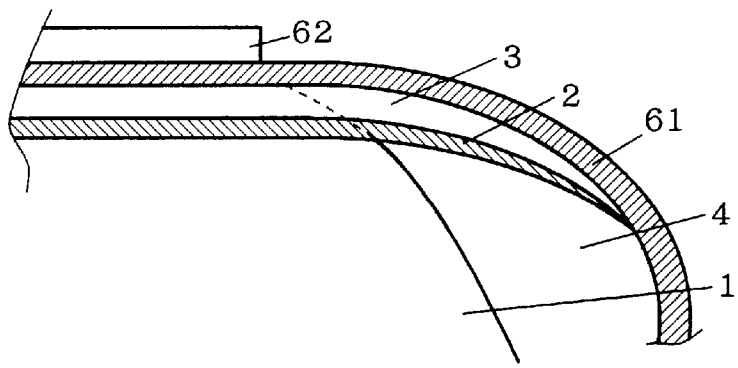

Then, as shown in FIG. 26, a nitride film 62 (oxidation-resistant film) having a thickness of 1000 to 4000 angstroms is formed so as to cover the central section of the upper major surface (on which the active regions are to be formed) of the SOI substrate 10. The process for forming the nitride film 62 comprises forming the nitride film 62 so as to entirely cover the SOI substrate 10 by the CVD process, forming a resist mask so as to cover the central section of the upper major surface of the SOI substrate 10, and selectively removing the nitride film 62 by dry etching using the resist mask as an etching mask.

Figure 27:
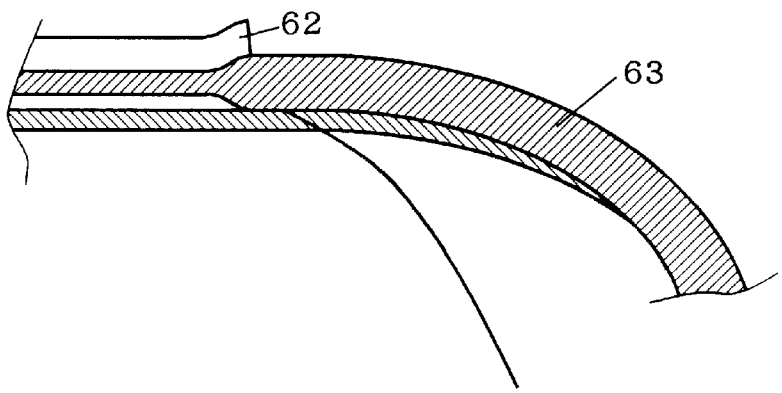

In the step shown in FIG. 27, an oxide film 63 (second oxide film) is formed by oxidizing the edge section and lower major surface of the SOI substrate 10. This oxidizing step is performed in a manner similar to the LOCOS oxidation by using the oxide film 61 exposed on the edge section and lower major surface of the SOI substrate 10 as an underlying oxide film. The conditions of this oxidizing step to be selected are such that all of the SOI layer 3 except under the nitride film 62 is oxidized. For example, when the SOI layer 3 under the nitride film 62 has a thickness of 2000 angstroms, the oxide film 63 should have a thickness of not less than 5000 angstroms.

Figure 28:
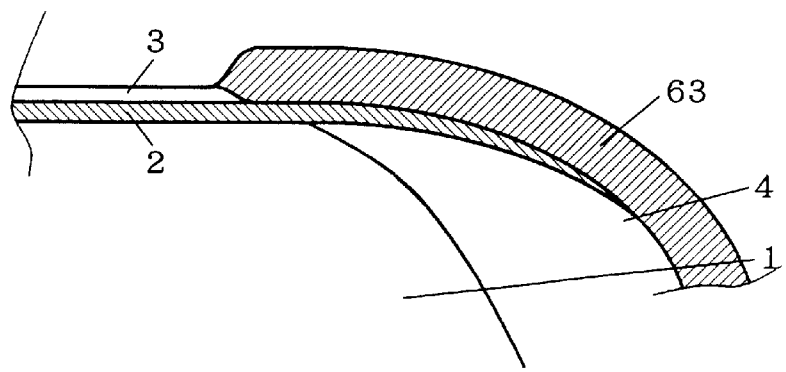

As depicted in FIG. 28, the nitride film 62 is removed, and thereafter the oxide film 61 which has been positioned under the nitride film 62 is removed. This provides the SOI layer 3 having the thickness which conforms to the specs of the desired semiconductor device.

As above discussed, setting the thickness of the underlying oxide film to the thickness suitable for thinning the SOI layer may reduce the number of times the oxide film is formed. It is needless to say that this process may be applied to the second, third and fifth preferred embodiments of the present invention described above.

F-2. Characteristic Function and Effect

In the step of thinning the SOI layer 3, as above described, the thickness of the oxide film 63 formed on the edge section and lower major surface of the SOI substrate 10 is also reduced. However, since the thickness of the oxide film 63 is originally greater than that of the oxide film 61, the oxide film 63 is not completely removed during the etching of the oxide film 61. Further, the oxide film 63 is formed so that the SOI layer 3 is not left on the edge section and lower major surface of the SOI substrate 10. This eliminates the drawback that part of the SOI layer 3 is lifted off into particles suspending in the etchant to prevent the formation failures of the semiconductor elements resulting from the presence of the particles, increasing the fabrication yield.

Additionally, the sixth preferred embodiment requires two steps of forming the oxide film, achieving the reduction in the number of steps. The sixth preferred embodiment requires only one step of oxidation associated with the thinning of the SOI layer, providing better controllability of the thickness of the SOI layer.

G. Seventh Preferred Embodiment

In the above described first to sixth preferred embodiments, the processing of the edge section of the SOI substrate or the bulk silicon substrate is solely performed. It is, however, needless to say that the steps of fabricating semiconductor elements in the central section of the upper major surface (on which the active regions are to be formed) of the SOI substrate or the bulk silicon substrate may be performed at the same time that the steps of processing the edge section are performed.

A process for performing the steps of fabricating semiconductor elements in the central section at the same time that the steps of processing the SOI substrate of the sixth preferred embodiment are performed will be described with reference to FIGS. 29 through 32. A process for performing the steps of fabricating semiconductor elements in the central section at the same time that the steps of processing the SOI substrate of a combination of the fifth and sixth preferred embodiments are performed will be described with reference to FIGS. 33 through 39.

Like reference characters are used to designate parts identical with those of the fifth and sixth preferred embodiments, and duplicate description will be dispensed with.

G-1. Modification of Sixth Preferred Embodiment

Figure 29:
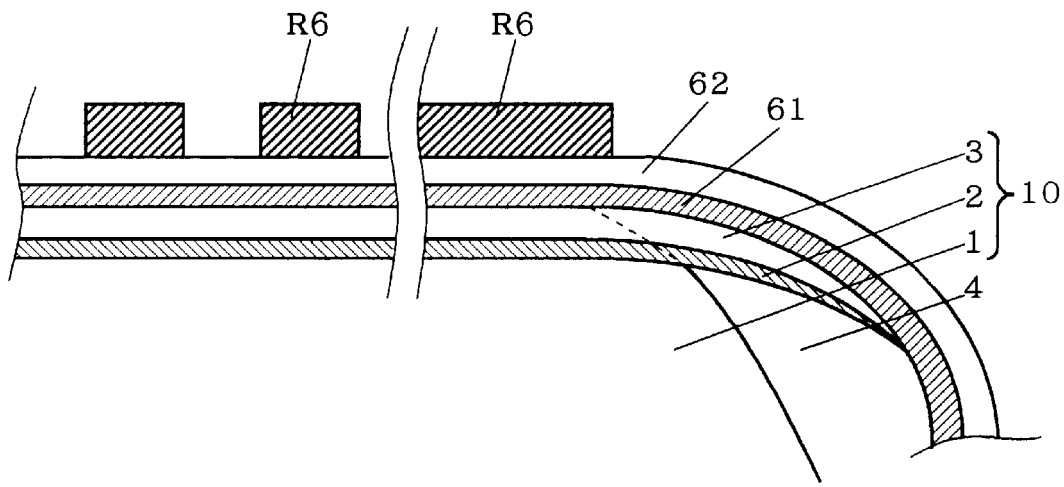
FIGS. 29 through 31 are sectional views illustrating the steps of processing the semiconductor substrate according to a seventh preferred embodiment of the present invention.

First, as shown in FIG. 29, the oxide film 61 having a thickness of, for example, 1600 angstroms is formed so as to entirely cover the SOI substrate 10. The polysilicon layer 4 is formed on the edge section and lower major surface of the silicon substrate 1 to constitute the PBC structure. The nitride film 62 having a thickness of 1000 to 4000 angstroms is formed so as to entirely cover the oxide film 61.

A resist mask R6 is selectively formed on the central section of the upper major surface of the SOI substrate 10.

Then, dry etching is performed using the resist mask R6 as an etching mask to selectively remove the nitride film 62 so that the nitride film 62 is left only under the resist mask R6.

Figure 30:
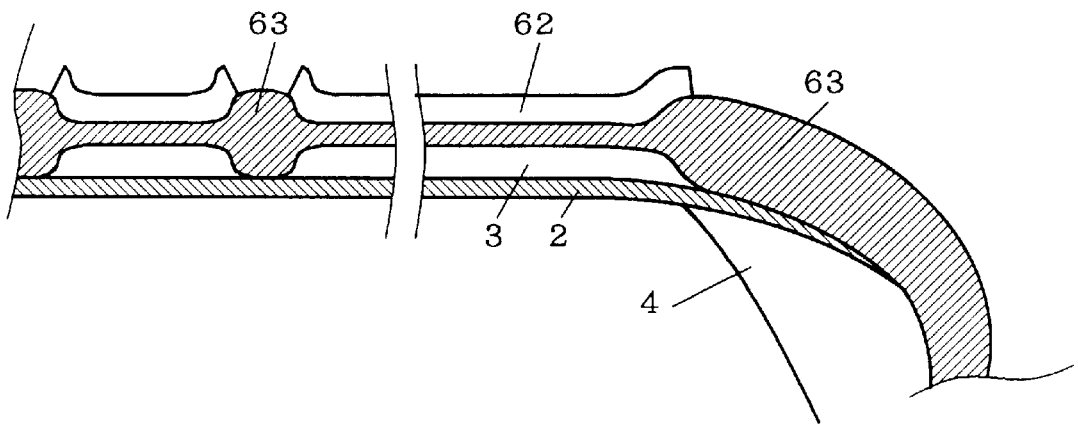

In the step shown in FIG. 30, the oxide film 63 is formed by oxidizing the edge section and lower major surface of the SOI substrate 10. This oxidizing step is performed in a manner similar to the LOCOS oxidation by using the oxide film 61 exposed on the upper major surface central section, edge section and lower major surface of the SOI substrate 10 as an underlying oxide film. The conditions of this oxidizing step to be selected are such that all of the SOI layer 3 except under the nitride film 62 is oxidized. For example, when the SOI layer 3 under the nitride film 62 has a thickness of 2000 angstroms, the oxide film 63 should have a thickness of not less than 5000 angstroms. Part of the oxide film 63 which is positioned on the central section of the upper major surface of the SOI substrate 10 serves as a field oxide film (LOCOS oxide film).

Figure 31:
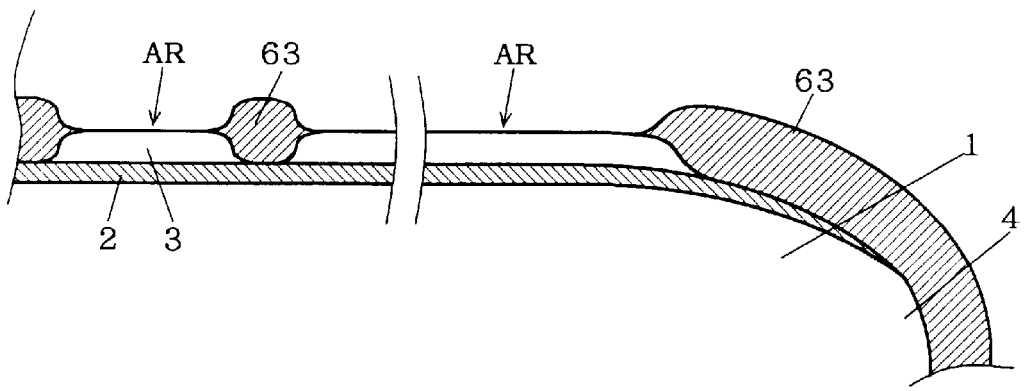

In the step shown in FIG. 31, the nitride film 62 is removed, and thereafter the oxide film 61 which has been positioned under the nitride film 62 is removed.

This provides the SOI layer 3 having the thickness which conforms to the specs of the desired semiconductor device. At this time, the thickness of the oxide film 63 formed on the edge section and lower major surface of the SOI substrate 10 is also reduced. However, since the thickness of the oxide film 63 is originally greater than that of the oxide film 61, the oxide film 63 is not completely removed during the etching of the oxide film 61.

Figure 32:
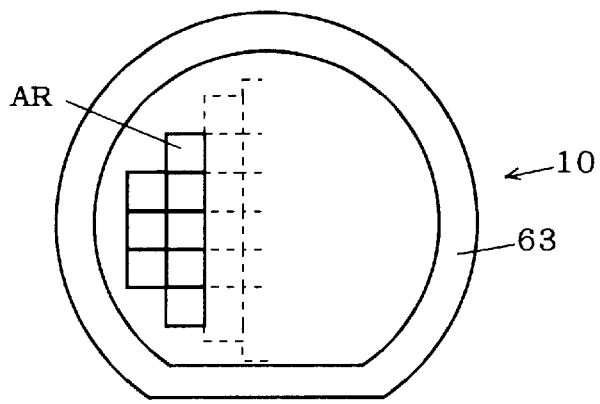
FIG. 32 is a plan view illustrating the steps of processing the semiconductor substrate according to the seventh preferred embodiment of the present invention.

FIG. 32 is a plan view of the SOI substrate 10 as viewed from above the upper major surface. The oxide film 63 is formed on the edge section of the SOI substrate 10, and active regions AR are formed in the central section thereof as shown in FIG. 32.

Subsequently, semiconductor elements are fabricated into the respective active regions AR defined by the field oxide film. During the fabrication, the oxide film 63 covers the edge section and lower major surface of the SOI substrate 10, and the oxide film 63 is formed so that the SOI layer 3 is not left in the edge section and lower major surface of the SOI substrate 10. This eliminates the drawback that part of the SOI layer 3 is lifted off into particles suspending in the etchant to prevent the formation failures of the semiconductor elements resulting from the presence of the particles, increasing the fabrication yield.

G-2. Modification of Combination of Fifth and Sixth Preferred Embodiments

Figure 33:
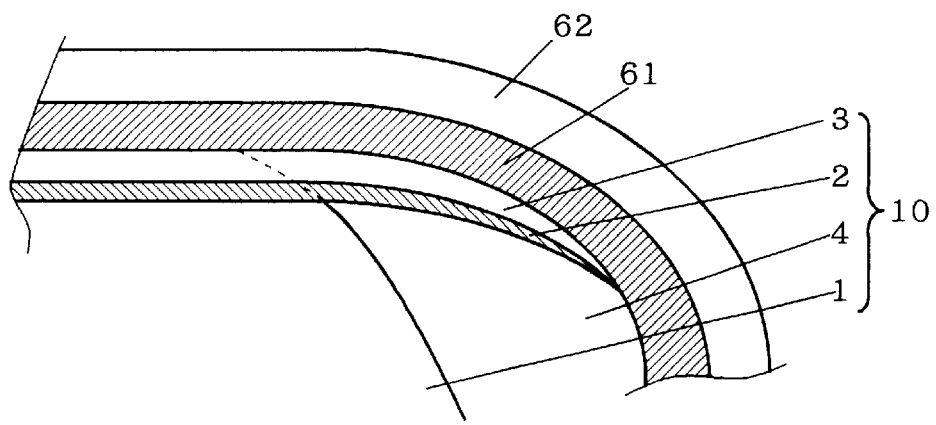
FIGS. 33 through 39 are sectional views illustrating the steps of processing the semiconductor substrate according to the seventh preferred embodiment of the present invention.

First, as shown in FIG. 33, the oxide film 61 having a thickness of, for example, 1600 angstroms is formed so as to entirely cover the SOI substrate 10. The polysilicon layer 4 is formed on the edge section and lower major surface of the silicon substrate 1 to constitute the PBC structure. The nitride film 62 having a thickness of 1000 to 4000 angstroms is formed so as to entirely cover the oxide film 61.

Figure 34:
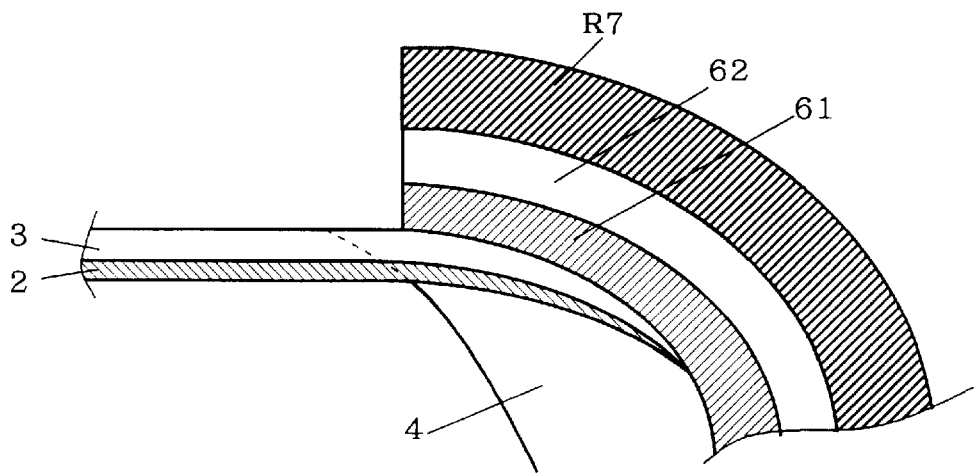

A resist mask R7 is selectively formed so as to cover the edge section and lower major surface of the nitride film 62 as shown in FIG. 34. In the central section of the upper major surface of the SOI substrate 10, the resist mask R7 is not formed and the nitride film 62 is exposed. The exposed nitride film 62 is removed by dry etching, and the oxide film 61 thereunder is removed by wet etching. Then, the SOI layer 3 is exposed.

Figure 35:
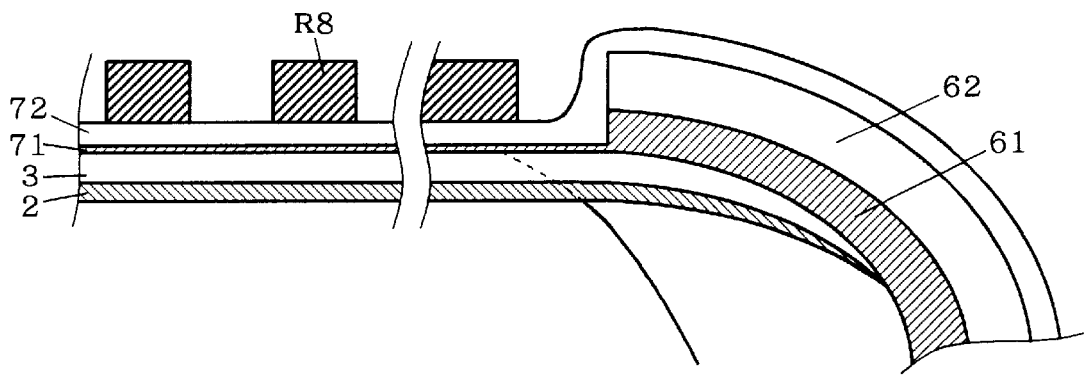

As shown in FIG. 35, an oxide film 71 having a thickness of, for example, 300 angstroms is formed on the central section of the upper major surface. The oxide film 71 may be formed by thermally oxidizing the SOI substrate 10 at a temperature on the order of 700 to 1100° C. or by the CVD process at a temperature on the order of 600 to 850° C. Subsequently, a nitride film 72 (oxidation-resistant film) having a thickness of, for example, 1500 angstroms is formed so as to entirely cover the SOI substrate 10. A resist mask R8 is selectively formed on the central section of the upper major surface of the SOI substrate 10.

Figure 36:
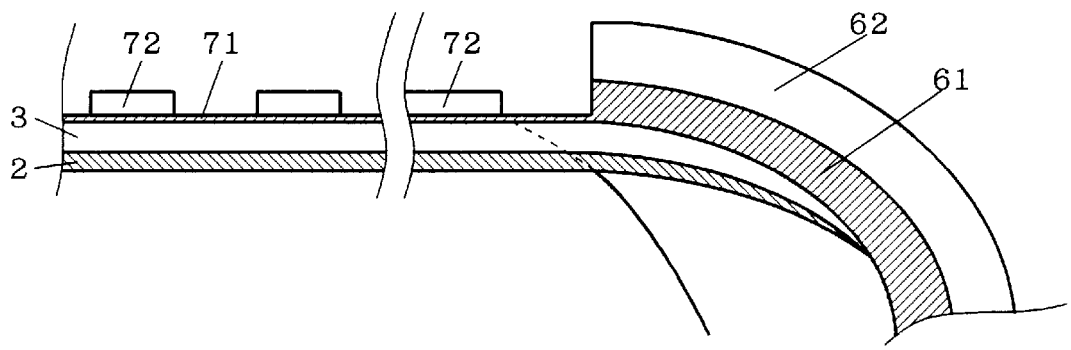

Dry etching is performed using the resist mask R8 as an etching mask to selectively remove the nitride film 72 so that the nitride film 72 is left only under the resist mask R8 as shown in FIG. 36. In the edge section of the SOI substrate 10, the nitride film 72 is removed, but the nitride film 62 which has been positioned under the nitride film 72 is left.

Figure 37:
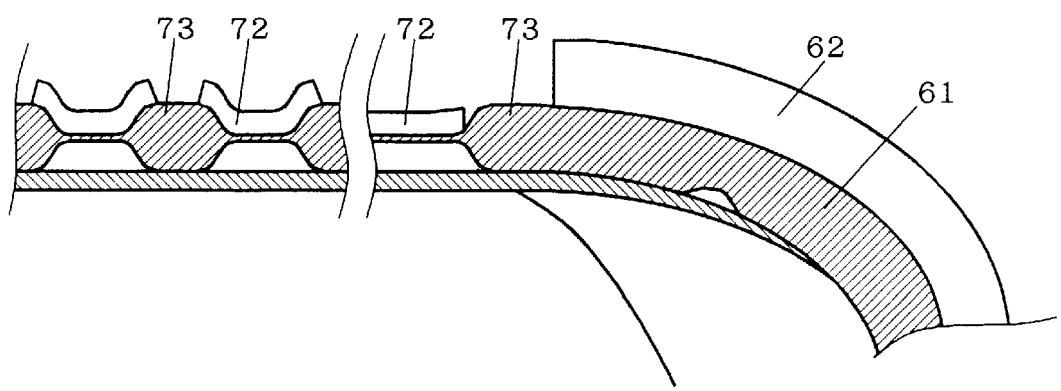

In the step shown in FIG. 37, an oxide film 73 is formed by oxidizing the edge section and lower major surface of the SOI substrate 10. This oxidizing step is performed in a manner similar to the LOCOS oxidation by using the oxide film 71 exposed in the upper major surface central section, edge section and lower major surface of the SOI substrate 10 as an underlying oxide film. The conditions of this oxidizing step to be selected are such that all of the SOI layer 3 except under the nitride film 72 is oxidized. For example, when the SOI layer 3 under the nitride film 72 has a thickness of 2000 angstroms, the oxide film 63 should have a thickness of not less than 5000 angstroms. Part of the oxide film 73 which is positioned on the central section of the upper major surface of the SOI substrate 10 serves as a field oxide film (LOCOS oxide film). Part of the oxide film 73 which is positioned on the edge section is joined to the oxide film 61.

Figure 38:
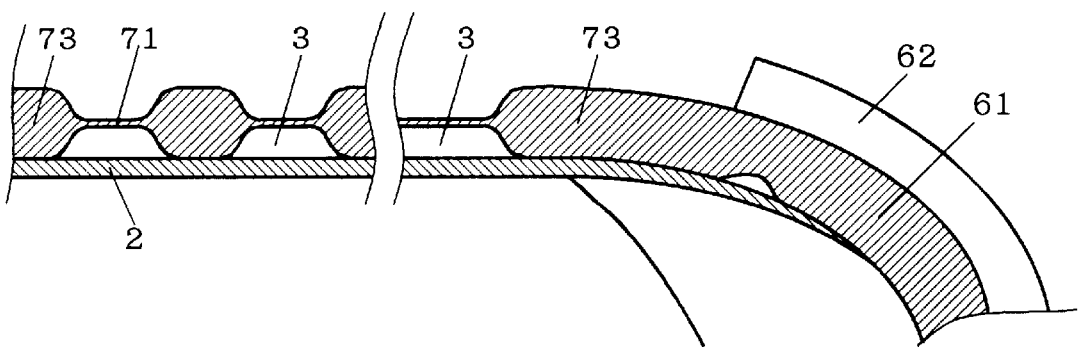

In the step shown in FIG. 38, the nitride film 72 is removed by dry etching. At this time, the nitride film 62 is also etched on the edge section of the SOI substrate 10. However, since the thickness of the nitride film 62 is greater than that of the nitride film 72, the nitride film 62 is not completely removed.

Figure 39:
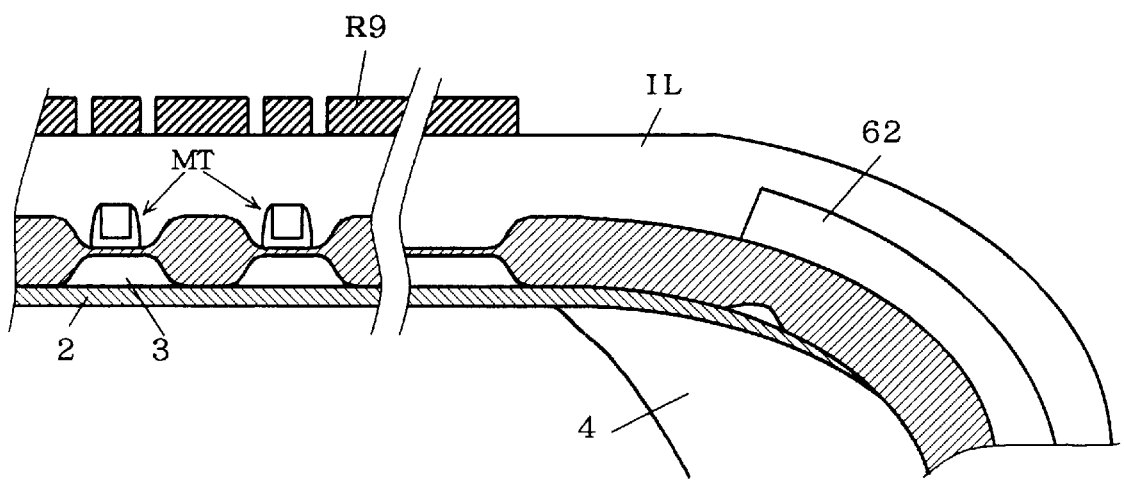
Figure 40:
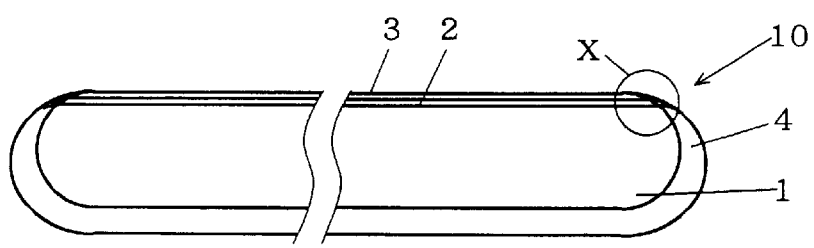
FIG. 40 is a sectional view of an SOI substrate.
Figure 41:
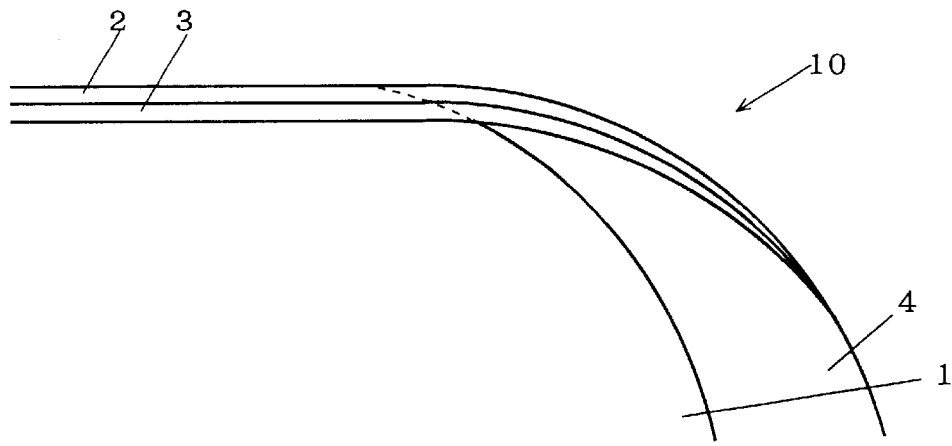
FIGS. 41 through 43 are sectional views illustrating the conventional steps of processing the SOI substrate.
Figure 42:
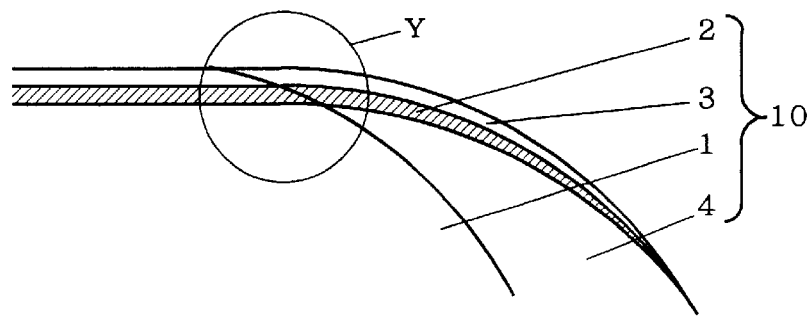
Figure 43:
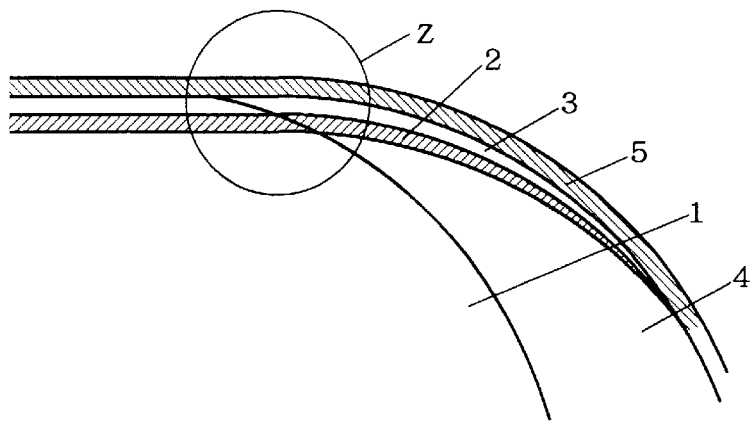

FIG. 39 shows MOS transistors formed in the active regions of the SOI substrate 10. With reference to FIG. 39, after the MOS transistors MT are formed in the active regions, the upper major surface of the SOI substrate 10 is covered with an interlayer insulating film IL, and a resist mask R9 is selectively formed on the interlayer insulating film IL. The interlayer insulating film IL is selectively removed using the resist mask R9 as an etching mask. Then, the nitride film 62 which covers the edge section and lower major surface eliminates the drawback that part of the SOI layer 3 is lifted off into particles suspending in the etchant.

In the above description, a double-layer structure comprised of the oxide film and the nitride film is used in the edge section of the SOI substrate 10. However, a triple-layer structure comprised of an oxide film, a nitride film, and an oxide film may be used in place of the double-layer structure. The use of the triple-layer structure allows the top oxide film to act as a mask against the etching of the nitride film during the removal of the nitride film after the LOCOS oxidation, preventing the nitride film from being etched in the edge section.

Although the nitride film is formed in position to prevent oxidation in the first to seventh preferred embodiments of the present invention as above described, the film functioning as a mask against oxidation is not limited to the nitride film. Any oxidation-resistant film may be used which is impermeable to oxygen serving as an oxidizing agent and which itself is not oxidized.

While the invention has been described in detail, the foregoing description is in all aspects illustrative and not restrictive. It is understood that numerous other modifications and variations can be devised without departing from the scope of the invention.

We claim:

1. A semiconductor substrate having a first major surface, a second major surface opposite from said first major surface, and a side surface, said first major surface including a central section in which active regions are to be formed and a peripheral section, said peripheral section and said side surface defining an edge section, said semiconductor substrate comprising:

a buried oxide film and an SOI layer formed in a sequentially stacked relation in said first major surface; and a thermal oxide film formed from said SOI layer in said edge section and having a thickness reaching said buried oxide film.

2. A semiconductor substrate having a first major surface, a second major surface opposite from said first major surface, and a side surface, said first major surface including a central section in which active regions are to be formed and a peripheral section, said peripheral section and said side surface defining an edge section, said semiconductor substrate comprising:

a buried oxide film and an SOI layer formed in a sequentially stacked relation in said first major surface, wherein said buried oxide film contains silicon islands, and wherein the density of said silicon islands is lower in said buried oxide film extending in said edge section than in said buried oxide film in said central section.

3. A semiconductor substrate having a first major surface, a second major surface opposite from said first major surface, and a side surface, said first major surface including a central section in which active regions are to be formed and a peripheral section, said peripheral section and said side surface defining an edge section, said semiconductor substrate comprising:

a buried oxide film and an SOI layer formed in a sequentially stacked relation in said first major surface, wherein said buried oxide film contains silicon islands, and wherein said buried oxide film and said SOI layer are not formed in said edge section, and a thermal oxide that does not contain silicon islands formed at least in said edge section on said first major surface.

4. The substrate according to claim 3, wherein said thermal oxide is formed over substantially all of said edge section.

* * * * *